(12) United States Patent
Lee et al.

(10) Patent No.: US 9,746,732 B2
(45) Date of Patent: Aug. 29, 2017

(54) DISPLAY DEVICE

(71) Applicant: SAMSUNG DISPLAY CO., LTD., Yongin-si, Gyeonggi-do (KR)

(72) Inventors: Jae Woo Lee, Cheonan-si (KR); Young Min Kwon, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/240,520

(22) Filed: Aug. 18, 2016

(65) Prior Publication Data
US 2017/0123284 A1 May 4, 2017

(30) Foreign Application Priority Data

Nov. 3, 2015 (KR) ........................ 10-2015-0153621

(51) Int. Cl.
*G06G 5/00* (2006.01)
*G02F 1/1362* (2006.01)
*H01L 27/12* (2006.01)
*G02F 1/133* (2006.01)
*G02F 1/1343* (2006.01)

(52) U.S. Cl.
CPC .... *G02F 1/136259* (2013.01); *G02F 1/13306* (2013.01); *G02F 1/134336* (2013.01); *G02F 1/136286* (2013.01); *H01L 27/124* (2013.01); *G02F 2001/136263* (2013.01)

(58) Field of Classification Search
CPC ..................................................... H01L 27/124
See application file for complete search history.

(56) References Cited

U.S. PATENT DOCUMENTS

| 2008/0018636 | A1 | 1/2008 | Chang | |
|---|---|---|---|---|
| 2008/0158127 | A1 | 7/2008 | Chang et al. | |
| 2014/0306941 | A1* | 10/2014 | Kim | H04M 1/0268 345/204 |
| 2015/0294618 | A1* | 10/2015 | Park | G09G 3/3291 345/214 |

* cited by examiner

*Primary Examiner* — Zandra Smith
*Assistant Examiner* — Andre' C Stevenson
(74) *Attorney, Agent, or Firm* — Cantor Colburn LLP

(57) ABSTRACT

A display device includes a substrate including an active region, a non-active region disposed outside the active region, and a driving region disposed on one side of the non-active region, gate lines disposed in the active region to extend in a row direction, data lines disposed in the active region to extend in a column direction, pixels connected to the gate lines and the data lines, repair wiring disposed in the non-active region, and a gate driving integrated circuit ("IC") disposed in the driving region, the gate driving IC generating gate driving signals and transmitting the gate driving signals to the gate lines, where the repair wiring includes a first sub-repair line connected to the gate driving IC, and a second sub-repair line disposed in the non-active region to extend in the column direction, to be connected to the first sub-repair line, and to overlap the gate lines.

16 Claims, 8 Drawing Sheets

DISPLAY DEVICE

This application claims priority to Korean Patent Application No. 10-2015-0153621 filed on Nov. 3, 2015, and all the benefits accruing therefrom under 35 U.S.C. §119, the content of which in its entirety is herein incorporated by reference.

BACKGROUND

1. Field

Exemplary embodiments of the invention relate to a display device, and more particularly, to a display device capable of repairing signal wiring for transmitting gate signals.

2. Description of the Related Art

Due to recent developments in portable electronic devices, a demand for a thin, light-weighted flat panel display ("FPD") device has steadily grown. Examples of the FPD device include a liquid crystal display ("LCD") device, an electrophoretic display ("EPD") device, an organic light-emitting diode ("OLED") device, an inorganic electro-luminescent ("EL") device, a field emission display ("FED") device, a surface-conduction electron-emitter display ("SED") device, a plasma display panel ("PDP") device, and a cathode ray tube ("CRT") display device.

The FPD device generally includes a plurality of signal lines for transmitting gate signals and data signals and switching devices to which the signal lines are connected. A typical display device may include data repair wiring for transmitting data signals on behalf of signal lines for transmitting data signals in case the signal lines for transmitting data signals are disconnected.

SUMMARY

A typical display device does not have any repair wiring for repairing signal lines for transmitting gate signals in case the signal lines for transmitting gate signals are disconnected.

Accordingly, yield of the typical display device may be lowered when the signal lines for transmitting gate signals are disconnected.

Exemplary embodiments of the invention provide a flat panel display ("FPD") device, which includes repair wiring for repairing signal lines for transmitting gate signals and is thus capable of improving the yield.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, a display device includes a substrate including an active region, a non-active region, which is disposed outside the active region, and a driving region, which is disposed on one side of the non-active region, a plurality of gate lines disposed in the active region to extend in a row direction, a plurality of data lines disposed in the active region to extend in a column direction, a plurality of pixels connected to the plurality of gate lines and the data lines, repair wiring disposed in the non-active region, and a gate driving integrated circuit (IC) disposed in the driving region, the gate driving IC generating gate driving signals and transmitting the gate driving signals to the gate lines, where the repair wiring includes a first sub-repair line, which is connected to the gate driving IC, and a second sub-repair line, which is disposed in the non-active region to extend in the column direction, to be connected to the first sub-repair line, and to overlap the gate lines.

In an exemplary embodiment, the repair wiring may include a first gate repair line, which has a second sub-repair line that overlaps odd-numbered gate lines, and a second gate repair line, which has a second sub-repair line that overlaps even-numbered gate lines.

In an exemplary embodiment, the first gate repair line and the second gate repair line may correspond to two different sides among four sides of the non-active region.

In an exemplary embodiment, two pixels of the plurality of pixels may be connected to each of the data lines.

In an exemplary embodiment, the display device further may include a plurality of gate signal transmission lines disposed in the active region, the plurality of gate signal transmission lines transmitting gate signals to the gate lines.

In an exemplary embodiment, the plurality of gate signal transmission lines extend in the column direction over the active region and the plurality of gate signal transmission lines and the plurality of data lines may be alternately disposed.

In an exemplary embodiment, the plurality of gate signal transmission lines mat be connected to the gate driving IC.

In an exemplary embodiment, the display device further may include a data driving IC disposed in the driving region and transmitting data driving signals to the data lines, where the data driving IC and the gate driving IC are disposed in the same region.

According to another exemplary embodiment of the invention a display device includes a substrate including an active region and a non-active region, which is disposed outside the active region, a plurality of gate lines disposed in the active region to extend in a row direction, a plurality of data lines disposed in the active region to extend in a column direction, a plurality of gate signal transmission lines disposed in the active region to extend in the column direction, the plurality of gate signal transmission lines and the plurality of data lines being alternately disposed, a plurality of pixels connected to the plurality of gate lines and the data lines, and gate repair wiring disposed in the non-active region to partially overlap the gate lines.

In an exemplary embodiment, the display device may further include a second substrate facing the first substrate, where the first substrate further includes a driving region, which is exposed by the second substrate.

In an exemplary embodiment, the display device may include a data driving IC disposed in the driving region and connected to the data lines, and a gate driving IC disposed in the driving region and connected to the plurality of gate signal transmission lines.

In an exemplary embodiment, the gate repair wiring may include a first gate repair line, which overlaps odd-numbered gate lines, and a second gate repair line, which overlaps even-numbered gate lines.

In an exemplary embodiment, the first gate repair line and the second gate repair line may correspond to two different sides among four sides of the non-active region.

In an exemplary embodiment, the first gate repair line may include a 1-1 sub-gate repair line, which is connected to the gate driving IC, and a 1-2 sub-gate repair line, which is connected to the 1-1 sub-gate repair line and extends in the column direction and to overlap the odd-numbered gate lines.

In an exemplary embodiment, the second gate repair line may include a 2-1 sub-gate repair line, which is connected to the gate driving IC, and a 2-2 sub-gate repair line, which is connected to the 2-1 sub-gate repair line and extends in the column direction and to overlap the even-numbered gate lines.

In an exemplary embodiment, two pixels of the plurality of pixels may be connected to each of the data lines.

According to the exemplary embodiments, gate repair wiring, which is capable of repairing signal lines for transmitting gate signals in case the signal lines are disconnected, may be provided, and thus, the yield of a display device may be improved.

Other features and exemplary embodiments will be apparent from the following detailed description, the drawings, and the claims.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
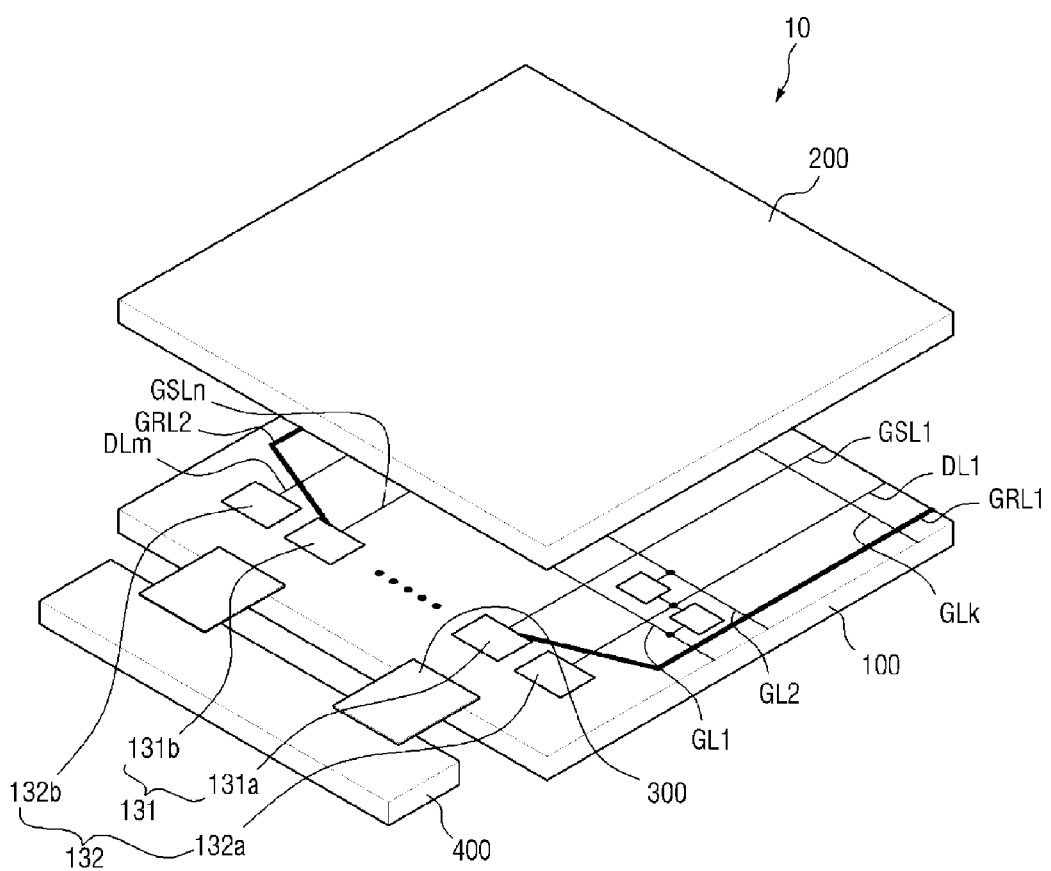
FIG. 1 is a perspective view of a display device according to an exemplary embodiment of the invention.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this invention will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. In an exemplary embodiment, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary embodiments of the invention will hereinafter be described with reference to the accompanying drawings.

Figure 2:
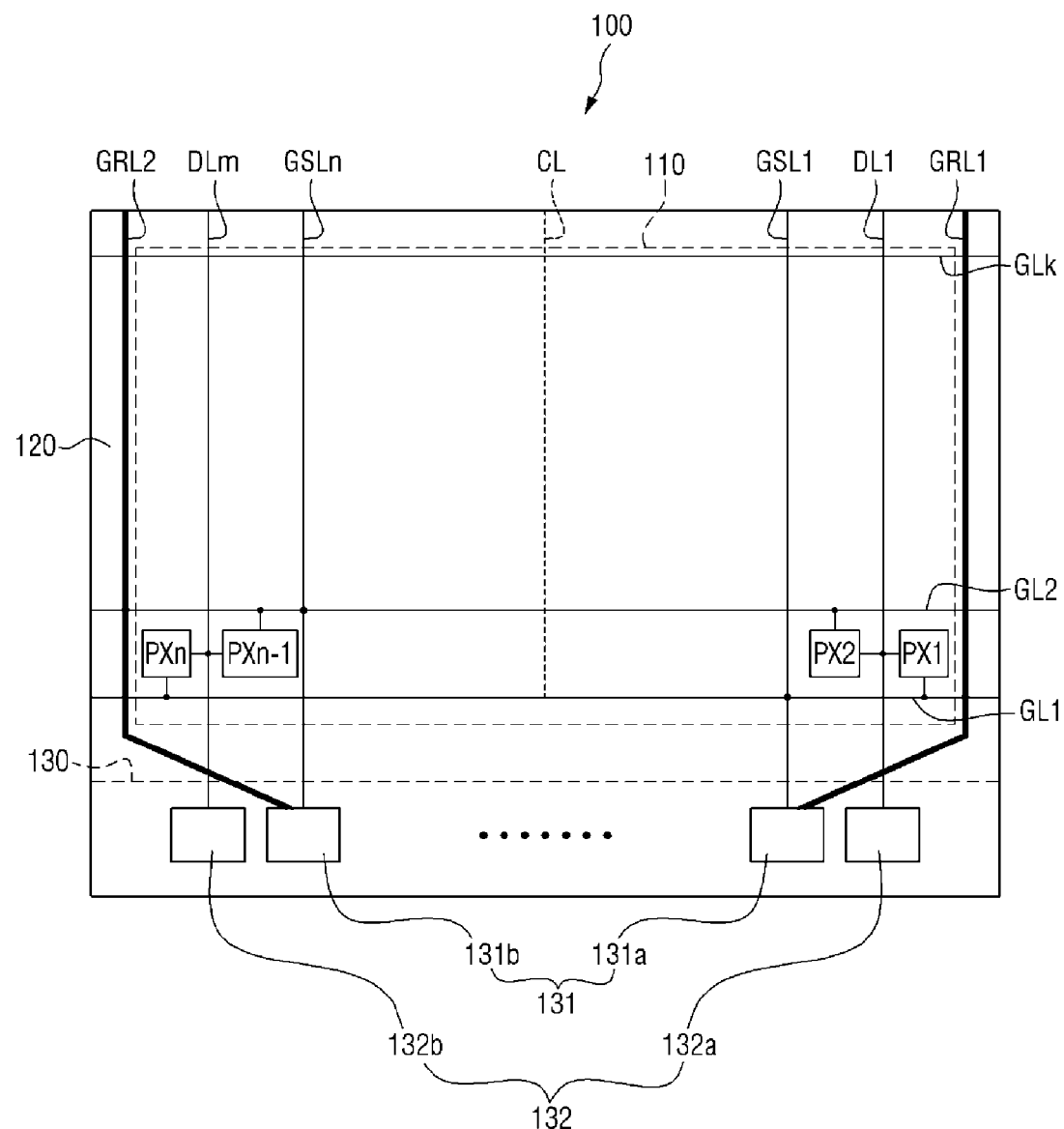
FIG. 2 is a plan view of a first substrate of FIG. 1.

FIG. 1 is a perspective view of a display device according to an exemplary embodiment of the invention, and FIG. 2 is a plan view of a first substrate of FIG. 1.

Referring to FIG. 1, a display device 10 may include a first substrate 100, a second substrate 200, signaling boards 300, and a printed circuit board ("PCB") 400.

The first substrate 100 and the second substrate 200 may be display panels for displaying an image. In exemplary embodiments, each of the first substrate 100 and the second substrate 200 may be one of a liquid crystal display ("LCD") panel, an electrophoretic display ("EPD") panel, an organic light-emitting diode ("OLED") panel, a light-emitting diode ("LED") panel, an inorganic electro-luminescent ("EL") panel, a field emission display ("FED") panel, a surface-conduction electron-emitter display ("SED") panel, a plasma display panel ("PDP"), and a cathode ray tube ("CRT"). The exemplary embodiment will hereinafter be described, taking LCD panels as an example, but the first substrate 100 and the second substrate 200 are not limited to being LCD panels. That is, various display panels other than LCD panels may be used as the first substrate 100 and the second substrate 200. The first substrate 100 and the second substrate 200 are spaced from each other and face each other. A liquid crystal layer (not illustrated) is interposed between the first substrate 100 and the second substrate 200, particularly, in the gap between the first substrate 100 and the second substrate 200.

As illustrated in FIG. 2, the first substrate 200 may include an active region 110, a non-active region 120, and a driving region 130.

In the active region 110, a plurality of gate lines GL1 to GLk, which extend in a row direction, a plurality of data lines DL1 to DLm, which intersect the gate lines GL1 to GLk and extend in a column direction, and a plurality of pixels PX, which are connected to the gate lines GL1 to GLk and the data lines DL1 to DLm, may be disposed, where k and m are natural numbers equal to or greater than two.

The gate lines GL1 to GLk are connected to a plurality of gate signal transmission lines GSL1 to GSLn, and transmit gate signals received from the gate signal transmission lines GSL1 to GSLn to the pixels PX where n is a natural number equal to or greater than two.

The gate signal transmission lines GSL1 to GSLn are electrically connected to gate driving integrated circuits ("IC"), which are disposed in the driving region 130, and transmit gate signals received from the gate driving ICs 131 to the gate lines GL1 to GLk. The gate signal transmission lines GSL1 to GSLn extend in a direction which intersects the gate lines GL1 to GLk, i.e., the column direction. That is, the gate signal transmission lines GSL1 to GSLn extend in the same direction as the data lines DL1 to DLm, and the gate signal transmission lines GSL1 to GSLn and the data lines DL1 to DLm may be alternately disposed. By arranging the gate signal transmission lines GSL1 to GSLn in the same direction as the data lines DL1 to DLm, the gate driving ICs 131 may be disposed on one side of the first substrate 100, i.e., in the driving region 130 of the first substrate 100, together with data driving ICs 132. Accordingly, the bezel width of the display device 10 may be reduced because there is no need to arrange the gate driving ICs 131, which are for driving gate signals, in the non-active region 120 of the first substrate 100. The gate signal transmission lines GSL1 to GSLn and the data lines DL1 to DLm have been described above as being alternately disposed, but the invention is not limited thereto.

The data lines DL1 to DLm are electrically connected to the data driving ICs 132, which are disposed in the driving region 130, and transmit data signals received from the data driving ICs 132 to the pixels PX. The number of data driving ICs 132 for driving the data lines DL1 to DLm may be reduced to a half of the number of data driving ICs of a typical display device because two pixels are connected to each data line. That is, each of the data lines DL1 to DLm is provided not for each row of pixels PX, but for two rows of pixels PX. Two pixels PX1 and PX2 connected to the data line DL1 may be connected to different gate lines, for example, but the invention is not limited thereto. That is, in an alternative example, the two pixels PX1 and PX2 connected to the data line DL1 may be connected to the same gate line. In this alternative example, data signals of different polarities may be applied to the data line DL1 at timings close to each other, and the two pixels PX1 and PX2 connected to the same gate line may be driven at the same time.

The pixels PX are connected to the gate lines GL1 to GLk and the data lines DL1 to DLm and display an image in response to gate signals and data signals being applied thereto.

The non-active region 120 may surround the active region 110. In the non-active region 120, a gate repair wiring (e.g., GRL1 and GRL2), which is for transmitting gate signals in case the gate signal transmission lines GSL1 to GSLn are open, i.e., disconnected, may be disposed. To prevent signal delays, the gate repair wiring (e.g., GRL1 and GRL2) may include a first gate repair line GRL1 and a second gate repair line GRL2. The gate repair wiring (e.g., GRL1 and GRL2) may be connected to their respective gate driving ICs. In an exemplary embodiment, the first gate repair line GRL1 may be connected to a first gate driving IC 131a, and the second gate repair line GRL2 may be connected to a second gate driving IC 131b. Since gate signals are transmitted via the gate repair wiring (e.g., GRL1 and GRL2) when the gate signal transmission lines GSL1 to GSLn are disconnected, the yield of the display device 10 may be improved.

In the driving region 130, the gate driving ICs 131 and the data driving ICs 132 may be disposed.

The gate driving ICs 131 may be electrically connected to the gate signal transmission lines GSL1 to GSLn in the active region 110 and to the gate repair wiring (e.g., GRL1 and GRL2) in the non-active region 120. The gate driving ICs 131 may receive gate signals transmitted thereto via the signaling boards 300, may convert the gate signals into gate driving signals, and may transmit the gate driving signals to the gate signal transmission lines GSL1 to GSLn in the active region 110. When one or more of the gate signal transmission lines GSL1 to GSLn are open, the gate driving ICs 131 may detect the open gate signal transmission lines and may control the gate driving signals to be applied via the gate repair wiring (e.g., GRL1 and GRL2) in the non-active region 120. The gate driving ICs 131 may include the first gate driving IC 131a, which is disposed on the right side of a central line CL of the active region 110, and the second gate driving IC 131b, which is disposed on the left side of the central line CL.

The data driving ICs 132 may be electrically connected to the data lines DL1 to DLm in the active region 110. The data driving ICs 132 receive data signals transmitted thereto via the signaling boards 300, converts the data signals into data driving signals, and transmits the data driving signals to the data lines DL1 to DLm in the active region 110. The data driving ICs 132 may include a first data driving IC 132a, which is disposed on the right side of the central line CL, and a second data driving IC 132b, which is disposed on the left side of the central line CL. In the exemplary embodiment, one data driving IC is disposed on both sides of the central line CL, but the invention is not limited thereto.

The second substrate 200 may face the first substrate 100, and may be coupled to the first substrate 100 through a sealing member (not illustrated). The liquid crystal layer may be interposed between the first substrate 100 and the second substrate 200 that are coupled together.

The signaling boards 300 may be disposed on the first substrate 100 and the PCB 400. First ends of the signaling boards 300 may be electrically connected to the driving region 130 of the first substrate 100, and second ends of the signaling boards 300 may be electrically connected to the PCB 400. In the illustrated exemplary embodiment, the gate driving ICs 131 and the data driving ICs 132 are disposed on the driving region 130 of the first substrate 100, but the invention is not limited thereto. That is, in an alternative exemplary embodiment, the gate driving ICs 131 and the data driving ICs 132 may be disposed on the signaling boards 300.

The PCB 400 controls gate signals and data signals input thereto from an external source to apply the gate signals and the data signals to the first substrate 100 via the signaling boards 300.

Figure 3:
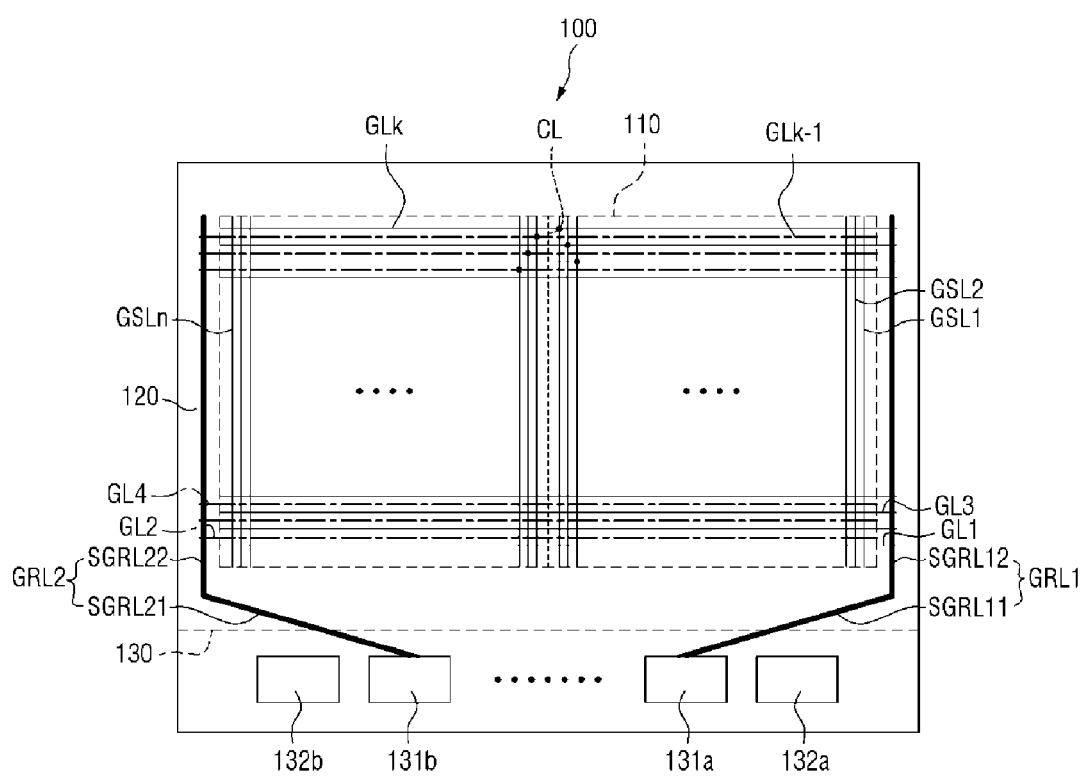
FIG. 3 is a plan view illustrating the connections of gate repair wiring of FIG. 1.
Figure 4:
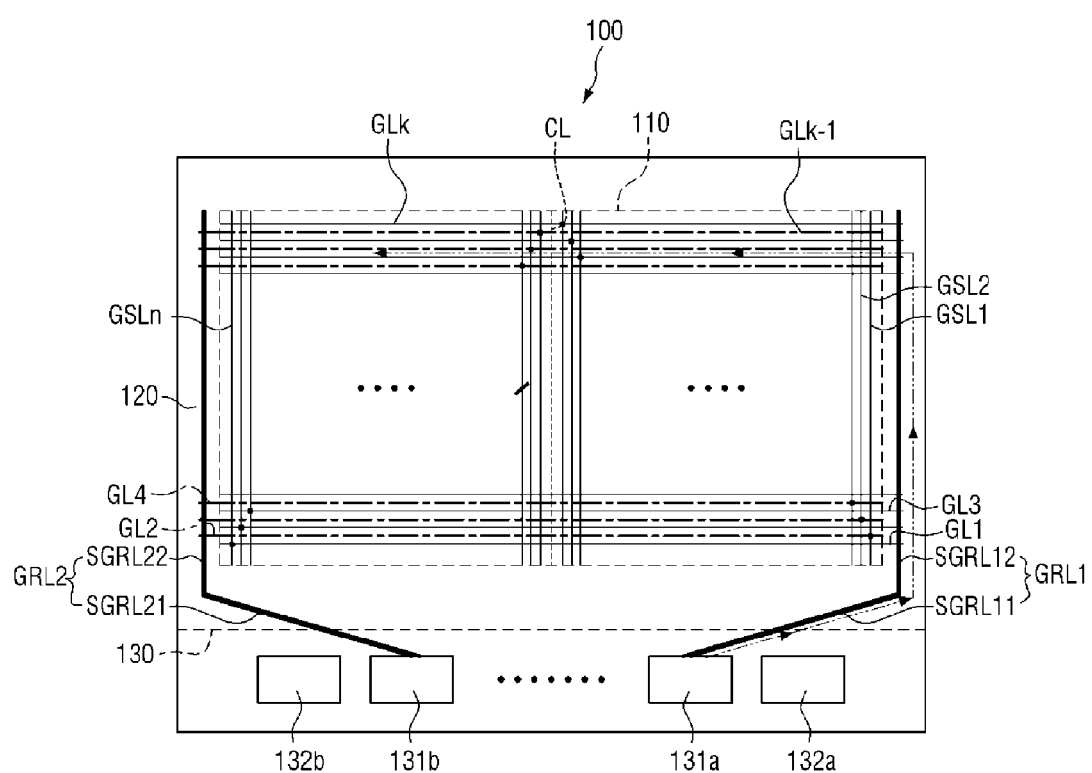
FIGS. 4 and 5 are plan views illustrating a gate repair method of the display device of FIG. 1
Figure 5:
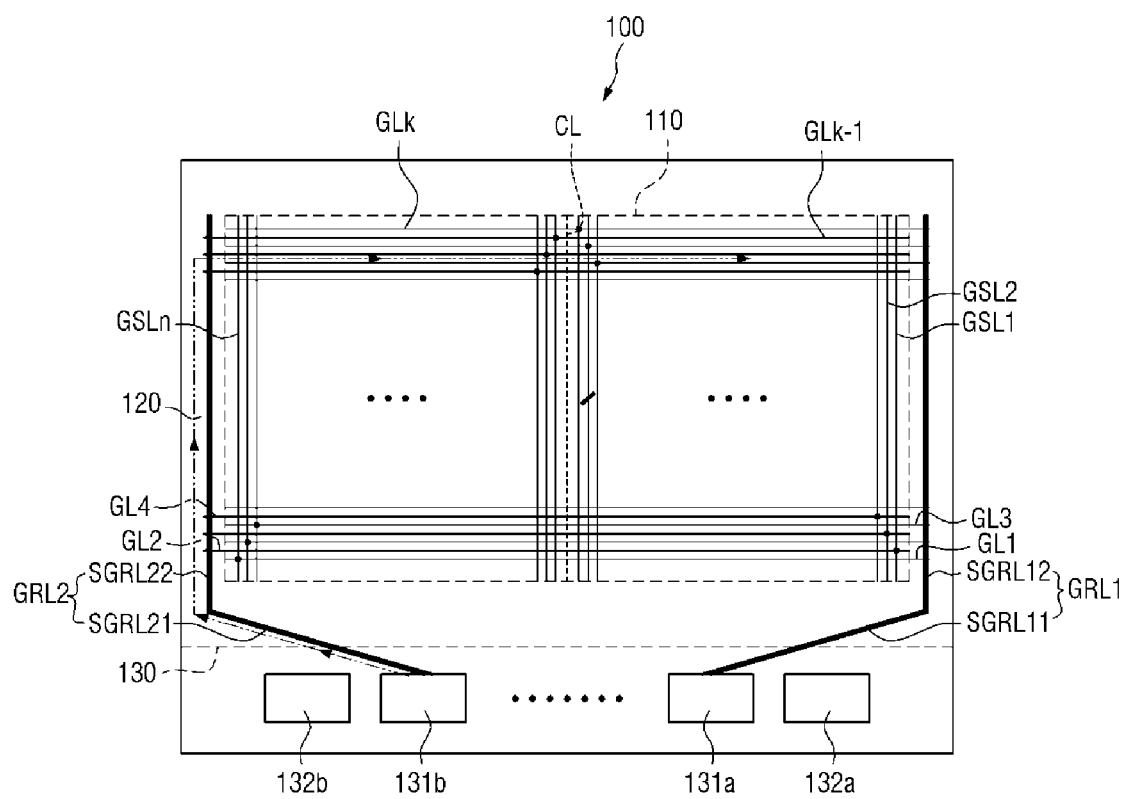

FIG. 3 is a plan view illustrating the connections of gate repair wiring of FIG. 1, and FIGS. 4 and 5 are plan views illustrating a gate repair method of the display device of FIG. 1.

For convenience, the data lines DL1 to DLm in the active region 110 are not illustrated in FIGS. 3 through 5.

Referring to FIG. 3, the gate repair wiring (e.g., GRL1 and GRL2) may include the first gate repair line GRL1 and the second gate repair line GRL2.

The first gate repair line GRL1 may include a 1-1 sub-repair line SGRL11, which is connected to the first gate driving IC 131a, and a 1-2 sub-repair line SGRL12, which is connected to the 1-1 sub-repair line SGRL11 and extends in the same direction as the gate signal transmission lines GSL1 to GSLn, i.e., the column direction. The 1-2 sub-repair line SGRL12 may overlap some of the gate lines GL1 to GLk, which are disposed in the active region 110. More specifically, the 1-2 sub-repair line SGRL12 may overlap odd-numbered gate lines GL1, GL3 to GLk-1. Accordingly, as illustrated in FIG. 4, when the gate signal transmission lines that transmit gate signals to the odd-numbered gate lines GL1, GL3 to GLk-1 are detected, through, for example, visual inspection, as being disconnected, the first gate repair line GRL1 may transmit gate signals to the pixels PX on behalf of gate signal transmission lines that transmit gate signals to the odd-numbered gate lines GL1, GL3 to GLk-1.

The second gate repair line GRL2 may include a 2-1 sub-repair line SGRL21, which is connected to the second gate driving IC 131b, and a 2-2 sub-repair line SGRL22, which is connected to the 2-1 sub-repair line SGRL21 and is disposed in the same direction as the gate signal transmission lines GSL1 to GSLn, i.e., the column direction. The 2-2 sub-repair line SGRL22 may overlap some of the gate lines GL1 to GLk, which are disposed in the active region 110. More specifically, the 2-2 sub-repair line SGRL22 may overlap even-numbered gate lines GL2, GL4 to GLk. Accordingly, as illustrated in FIG. 5, when the gate signal transmission lines that transmit gate signals to the even-numbered gate lines GL2, GL4 to GLk are detected through, for example, visual inspection, as being disconnected, the second gate repair line GRL2 may transmit gate signals to the pixels PX on behalf of gate signal transmission lines that transmit gate signals to the even-numbered gate lines GL2, GL4 to GLk.

Figure 6:
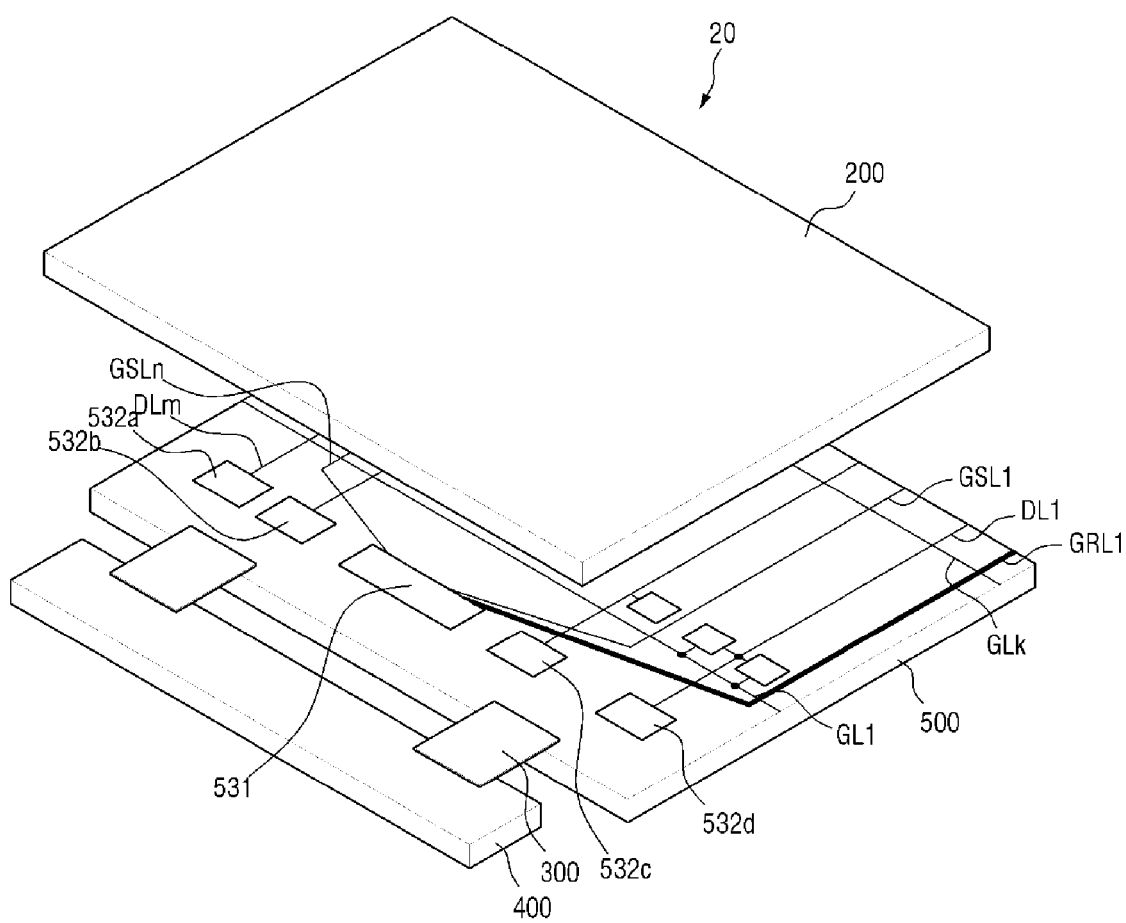
FIG. 6 is a perspective view of a display device according to another exemplary embodiment of the invention.

FIG. 6 is a perspective view of a display device according to another exemplary embodiment of the invention.

Referring to FIG. 6, a display device 20 may include a first substrate 500, a second substrate 200, signaling boards 300, and a PCB 400. The structure of the display device 20 is the same as the structure of the display device 10 of FIGS. 1 through 5 except for the first substrate 500, and thus, detailed descriptions of the elements of the display device 20 except for a description of the first substrate 500 will be omitted. An active region 510 of the first substrate 500 is similar to the active region 110 of the first substrate 100, and thus, a detailed description thereof will also be omitted.

A non-active region 520 may surround the active region 510. In the non-active region 520, gate repair wiring GRL, which is for transmitting gate signals in case a plurality of gate signal transmission lines GSL1 to GSLn are open, i.e., disconnected, may be disposed. The gate repair wiring GRL may be disposed on one side of the non-active region 520, for example, on one of the left and right sides of the non-active region 520. The gate repair wiring GRL may be connected to a gate driving IC 531.

In a driving region 530, the gate driving IC 531 and data driving ICs 532 may be disposed.

The gate driving IC 531 may be electrically connected to the gate signal transmission lines GSL1 to GSLn in the active region 510 and the gate repair wiring GRL in the non-active region 520. The gate driving IC 531 may receive gate signals transmitted thereto via the signaling boards 300, may convert the gate signals into gate driving signals, and may transmit the gate driving signals to the gate signal transmission lines GSL1 to GSLn in the active region 510. When one or more of the gate signal transmission lines GSL1 to GSLn are open, the gate driving IC 531 may detect the open gate signal transmission lines and may control the gate driving signals to be applied via the gate repair wiring GRL in the non-active region 520.

The data driving ICs 532 may be electrically connected to a plurality of data lines DL1 to DLm in the active region 510. The data driving ICs 532 receive data signals transmitted thereto via the signaling boards 300, converts the data signals into data driving signals, and transmits the data driving signals to the data lines DL1 to DLm in the active region 510. A plurality of data driving ICs 532 may be provided in a driving region 530.

Figure 7:
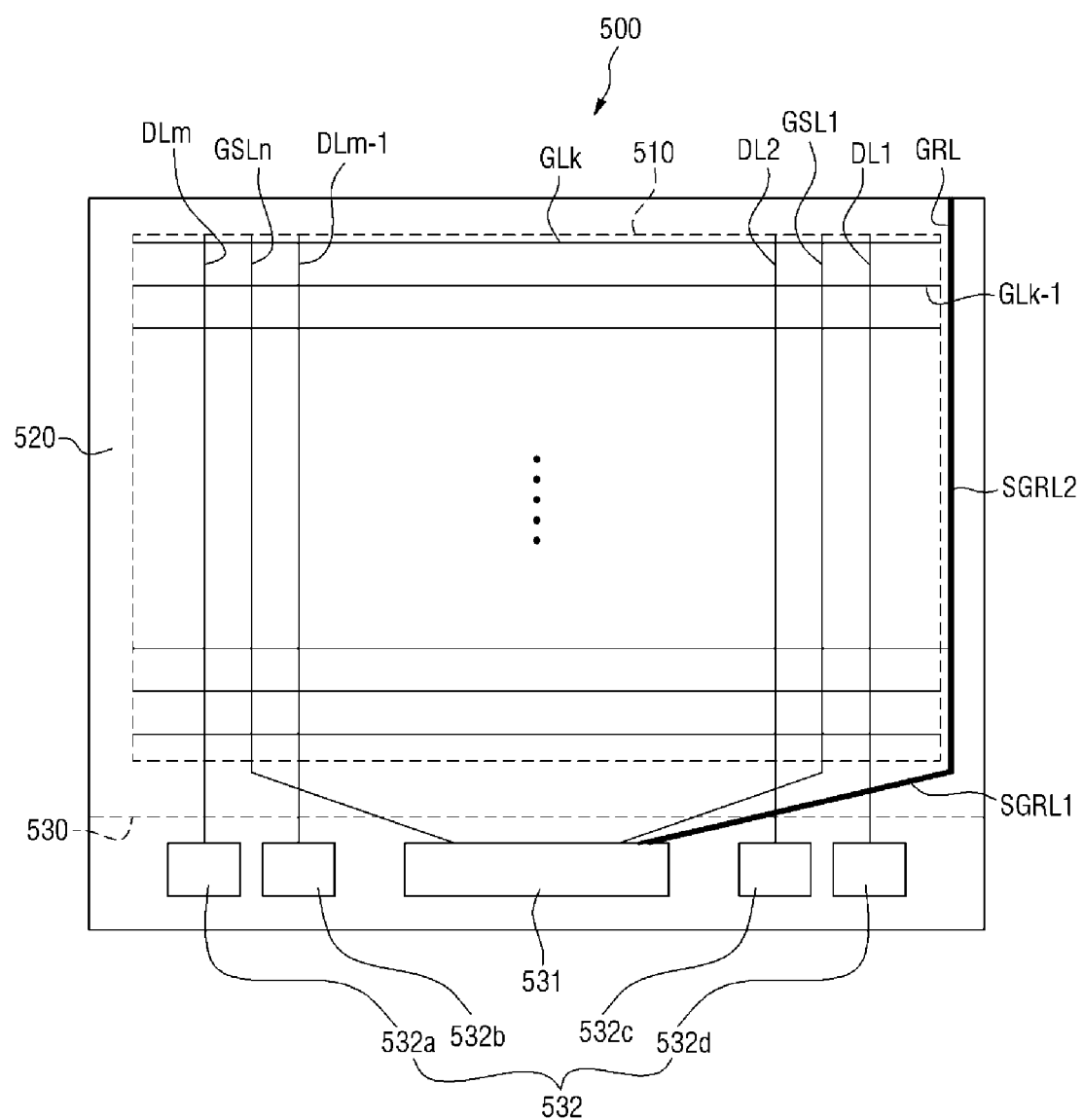
FIG. 7 is a plan view illustrating the connections of gate repair wiring of FIG. 6.
Figure 8:
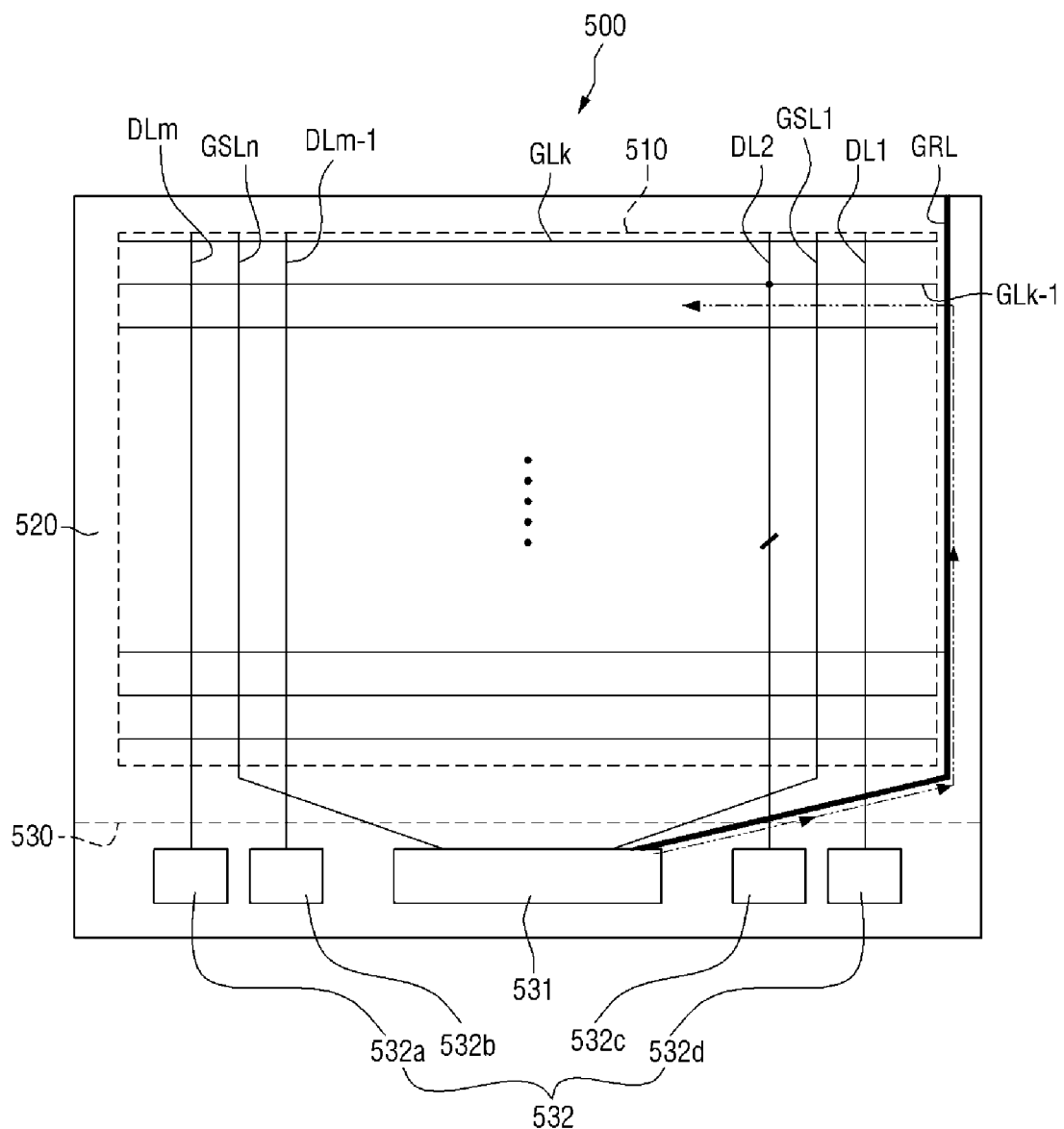
FIG. 8 is a plan view illustrating a gate repair method of the display device of FIG. 6.

FIG. 7 is a plan view illustrating the connections of gate repair wiring of FIG. 6, and FIG. 8 is a plan view illustrating a gate repair method of the display device of FIG. 6.

For convenience, the data lines DL1 to DLm in the active region 510 are not illustrated in FIGS. 7 and 8.

Referring to FIG. 7, the gate repair wiring GRL may include a first sub-repair line SGRL1, which is connected to the gate driving IC 531, and a second sub-repair line SGRL2, which is connected to the first sub-repair line SGRL1 and is disposed in the same direction as the gate signal transmission lines GSL1 to GSLn, i.e., the column direction. The second sub-repair line SGRL2 may overlap all the gate lines GL1 to GLk, which are disposed in the active region 510. Accordingly, as illustrated in FIG. 8, when the gate signal transmission lines GSL1 to GSLn are disconnected, the gate repair wiring GRL may transmit gate signals to the pixels PX on behalf of the gate signal transmission lines GSL1 to GSLn, regardless of the distinction between odd rows and even rows.

The gate repair wiring GRL does not surround the non-active region 520, but is formed by connecting the first sub-repair line SGRL1, which is connected to the gate driving IC 531 in the driving region 530, and the second sub-repair line SGRL2, which extends in the same direction as the gate signal transmission lines GSL1 to GSLn, i.e., the column direction, and is electrically connected to the gate lines GL1 to GLk. Thus, there is no need to provide an additional amplifier.

However, the effects of the invention are not restricted to the one set forth herein. The above and other effects of the invention will become more apparent to one of daily skill in the art to which the invention pertains by referencing the claims.

The foregoing is illustrative of the invention and is not to be construed as limiting thereof. Although a few embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A display device, comprising:
   a substrate including an active region, a non-active region, which is disposed outside the active region, and a driving region, which is disposed on one side of the non-active region;
   a plurality of gate lines disposed in the active region to extend in a row direction;
   a plurality of data lines disposed in the active region to extend in a column direction;
   a plurality of pixels connected to the plurality of gate lines and the plurality of data lines;
   repair wiring disposed in the non-active region; and
   a gate driving integrated circuit disposed in the driving region, the gate driving integrated circuit generating gate driving signals and transmitting the gate driving signals to the plurality of gate lines,
   wherein the repair wiring includes a first sub-repair line, which is connected to the gate driving integrated circuit, and a second sub-repair line, which is disposed in the non-active region to extend in the column direction, to be connected to the first sub-repair line, and to overlap the plurality of gate lines.

2. The display device of claim 1, wherein the repair wiring includes a first gate repair line, which has a second sub-repair line which overlaps odd-numbered gate lines of the plurality of gate lines, and a second gate repair line, which has a second sub-repair line which overlaps even-numbered gate lines of the plurality of gate lines.

3. The display device of claim 2, wherein the first gate repair line and the second gate repair line correspond to two different sides among four sides of the non-active region.

4. The display device of claim 1, wherein two pixels of the plurality of pixels are connected to each of the plurality of data lines.

5. The display device of claim 1, further comprising:
   a plurality of gate signal transmission lines disposed in the active region, the plurality of gate signal transmission lines transmitting gate signals to the plurality of gate lines.

6. The display device of claim 5, wherein the plurality of gate signal transmission lines extends in the column direction over the active region, and the plurality of gate signal transmission lines and the plurality of data lines are alternately disposed.

7. The display device of claim 6, wherein the plurality of gate signal transmission lines is connected to the gate driving integrated circuit.

8. The display device of claim 1, further comprising:
   a data driving integrated circuit disposed in the driving region and transmitting data driving signals to the plurality of data lines,
   wherein the data driving integrated circuit and the gate driving integrated circuit are disposed in the same region.

9. A display device, comprising:
   a substrate including an active region and a non-active region, which is disposed outside the active region;
   a plurality of gate lines disposed in the active region to extend in a row direction;
   a plurality of data lines disposed in the active region to extend in a column direction;
   a plurality of gate signal transmission lines disposed in the active region to extend in the column direction, the plurality of gate signal transmission lines and the plurality of data lines being alternately disposed;
   a plurality of pixels connected to the plurality of gate lines and the plurality of data lines; and
   gate repair wiring disposed in the non-active region to partially overlap the plurality of gate lines.

10. The display device of claim 9, further comprising:
    a second substrate facing the first substrate,
    wherein the first substrate further includes a driving region, which is exposed by the second substrate.

11. The display device of claim 10, comprising:
    a data driving integrated circuit disposed in the driving region and connected to the plurality of data lines; and
    a gate driving integrated circuit disposed in the driving region and connected to the plurality of gate signal transmission lines.

12. The display device of claim 11, wherein the gate repair wiring includes a first gate repair line, which overlaps odd-numbered gate lines of the plurality of gate lines, and a second gate repair line, which overlaps even-numbered gate lines of the plurality of gate lines.

13. The display device of claim 12, wherein the first gate repair line and the second gate repair line correspond to two different sides among four sides of the non-active region.

14. The display device of claim 13, wherein the first gate repair line includes a 1-1 sub-gate repair line, which is connected to the gate driving integrated circuit, and a 1-2 sub-gate repair line, which is connected to the 1-1 sub-gate repair line and extends in the column direction and to overlap the odd-numbered gate lines.

15. The display device of claim 13, wherein the second gate repair line includes a 2-1 sub-gate repair line, which is connected to the gate driving integrated circuit, and a 2-2 sub-gate repair line, which is connected to the 2-1 sub-gate repair line and extends in the column direction and to overlap the even-numbered gate lines.

16. The display device of claim 9, wherein two pixels of the plurality of pixels are connected to each of the plurality of data lines.

* * * * *